United States Patent
Feiweier (12) 
(10) Patent No.: US 6,734,672 B2
(45) Date of Patent: May 11, 2004

(54) METHOD FOR THE AUTOMATIC MEASUREMENT OF ACOUSTIC RESONANCE OF A MAGNETIC RESONANCE TOMOGRAPHY APPARATUS

(75) Inventor: Thorsten Feiweier, Poxdorf (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/425,806

(22) Filed: Apr. 29, 2003

(65) Prior Publication Data

US 2003/0206015 A1 Nov. 6, 2003

(30) Foreign Application Priority Data

May 2, 2002 (DE) .......................... 102 19 766

(51) Int. Cl.[7] ................................ G01V 3/00
(52) U.S. Cl. ....................... 324/309; 324/307
(58) Field of Search ................ 324/309, 307, 324/314, 312, 306, 318, 322

(56) References Cited

U.S. PATENT DOCUMENTS 6,236,204 B1 * 5/2001 Heid .......................... 324/309
6,407,548 B1 * 6/2002 Dietz ......................... 324/307
6,452,391 B1 * 9/2002 Bernstein et al. .......... 324/309

\* cited by examiner

Primary Examiner—Louis M. Arana
(74) Attorney, Agent, or Firm—Schiff Hardin LLP (57) ABSTRACT

In a method for determining acoustic resonances in a magnetic resonance tomography system, a resonance measurement is implemented by applying a number of alternating gradient pulses that have a fixed time spacing relative to one another, applying an excitation pulse, and obtaining one or more MR signals, the MR signal of the resonance measurement is evaluated with respect to at least one parameter characterizing the acoustic resonance of the MRT system, the aforementioned steps are repeated with variation of the time spacing of the gradient pulses, a resonance curve is formed on the basis of the value of a characteristic parameter of the resonance measurement as function of the varied time spacing, and the resonance or resonances of the MRT system are determined from the resonance curve.

26 Claims, 8 Drawing Sheets

Sampling path in the k-space

METHOD FOR THE AUTOMATIC MEASUREMENT OF ACOUSTIC RESONANCE OF A MAGNETIC RESONANCE TOMOGRAPHY APPARATUS

BACKGROUND OF THE INVENTION

1. Field of the Invention

The present invention is directed in general to magnetic resonance tomography as employed in medicine for examining patients. The present invention is more specifically directed to a method for the automatic determination of system-specific acoustic or mechanical resonances in an individual manner for each magnetic resonance tomography apparatus. Given knowledge of such resonances, they can be avoided during data acquisition from an examination subject in the MR apparatus by limitations of the system parameters.

2. Description of the Prior Art

MRT is based on the physical phenomenon of nuclear magnetic resonance and has been successfully utilized for more than 15 years as an imaging method in medicine and in biophysics. In this examination modality, the subject is disposed in a strong, constant magnetic field. As a result, the nuclear spins of the atoms in the subject, which were previously irregularly oriented, are aligned. Radiofrequency waves can then excite these "ordered" nuclear spins to a precessional movement. This precession generates the actual measured signal in MRT that is picked up with suitable reception coils. The measured subject can be spatially encoded in all three spatial directions by utilizing non-homogeneous magnetic fields generated respectively by gradient coils.

In one method for generating MRT images, a slice, for example in the z-direction of a Cartesian coordinate system, is first selectively excited. The encoding of the location information in the slice ensues combined phase and frequency encoding with two orthogonal gradient fields that, in the example of a slice excited in the z-direction, are generated in the x-direction and the y-direction by the aforementioned gradient coils. The imaging sequence is repeated N times for different values of the phase encoding gradient, for example Gx, and the magnetic resonance signal is digitized and stored N times in each sequence execution in the presence of the readout gradient Gy. A number matrix (matrix in k-space) with N×N data points is obtained in this way. An MR image of the observed slice having a resolution of N×N pixels can be directly reconstructed from this dataset by means of a two-dimensional Fourier transformation.

The method allows a free selection of the slice to be imaged, so that tomograms of the human body can be acquired in all directions. As a "non-invasive" examination method, MRT is distinguished first and foremost as a tomographic method in medical diagnostics by a versatile contrast capability. Due to the excellent presentation of the soft tissue, MRT has developed into a method that is often superior to X-ray computed tomography (CT). MRT is currently based on the application of spin echo sequences and gradient echo sequences that enable an excellent image quality with measuring times in the range of seconds through minutes.

Constant technical improvements of the components of MRT devices and the introduction of fast imaging sequences have created an increasing number of medical applications for MRT. Real-time imaging for supporting minimally invasive surgery, functional imaging in neurology and perfusion measurement in cardiology are examples.

Figure 9:
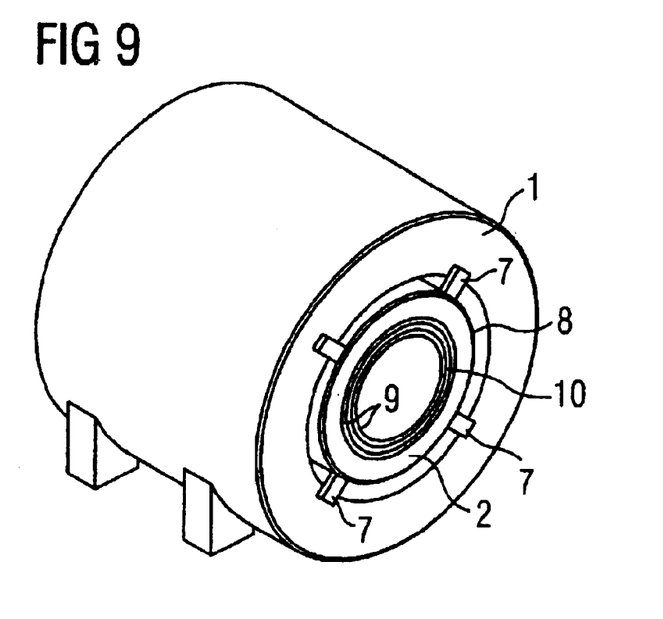
FIG. 9 is a perspective view of the basic field magnet of a conventional MRT apparatus.

The basic structure of one of the components of such an MRT apparatus is shown in FIG. 9. This component includes superconducting basic field magnet 1 (for example, an axial superconducting magnet with active stray field shielding) that generates a homogeneous basic magnetic field in an interior space. The inside of the superconducting basic field magnet 1 is composed of coils situated in liquid helium. The basic field magnet is surrounded by a double shell cryostat (not shown) that is usually composed of stainless steel. The inner shell that contains the liquid helium and also partly serves as a winding body for the magnet coils is suspended at the outer shell via poorly thermally conductive rods, the outer shell being at room temperature. A vacuum exists between the inner and outer shells. The inner and outer shells are referred to as magnet vessel.

The cylindrical gradient coil 2 is concentrically introduced into the inside of a carrying tube in the interior of the basic field magnet 1 by means of carrier elements 7. The carrying tube is outwardly limited by an outer shell 8 and inwardly limited by an inner shell 9.

Figure 10:
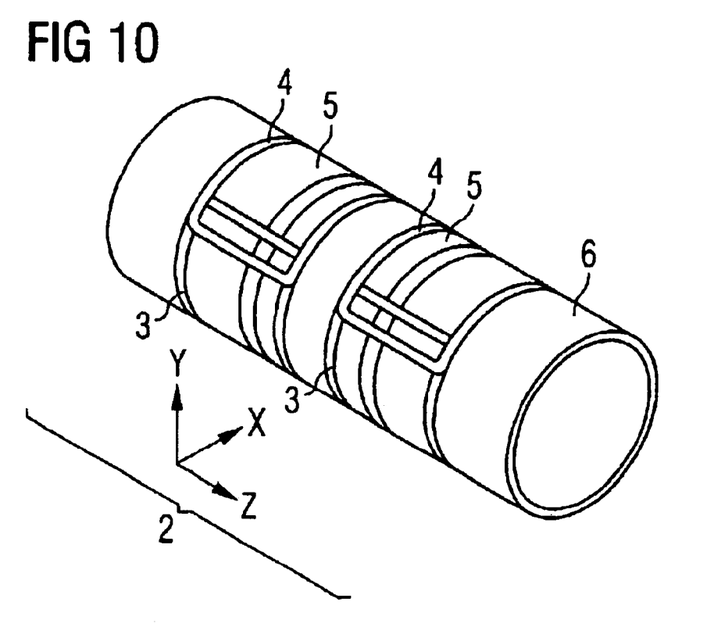
FIG. 10 is a perspective view of the gradient coil system of a conventional MRT apparatus having three gradient sub-coils.

The gradient coil 2 has partial windings that respectively generates gradient fields that are proportional to the impressed current and are spatially perpendicular to one another. As shown in FIG. 10, the gradient coil 2 has an x-coil 3, a y-coil 4 and a z-coil 5 that are respectively wound around the coil core 6 and thus generate respective gradient fields in the direction of the Cartesian coordinates x, y and z. Each of these gradient coils 3, 4 and 5 is equipped with its own power supply in order to generate independent current pulses with correct amplitude and at the proper time in conformity with the sequence programmed in the pulse sequence controller.

The radio-frequency resonator (RF coil or antenna; not shown in FIGS. 4 and 5) is situated inside the gradient coil 2. It converts the RF pulses supplied from a power transmitter into an electromagnetic alternating field and subsequently converts the alternating field emitted by the precessing nuclear moment into a voltage supplied to the reception branch.

Since the gradient switching times should be as short as possible, gradient rise rates on the order of magnitude of a few 10 mT/m are necessary. In an extremely strong magnetic field like that generated by the basic field magnet 1 (typically between 0.2 and 1.5 Tesla), strong Lorentz forces occur given such switching events. All system components (housing, covers, shell of the basic field magnet, RF body coil, etc.) that are mechanically coupled to the gradient system move (vibrate) due to the influence of these forces.

Since the gradient coil is almost always surrounded by conductive structures (for example, magnet vessel of stainless steel), the pulsed fields create eddy currents in them that, due to interaction with the basic magnetic field, exert forces on these structures and likewise cause them to move. It is standard in many imaging methods to employ periodically repeated gradient pulses, thereby causing a forced mechanical oscillation of the system to occur. If excitation occurs with periods/frequencies that correspond exactly to one of the natural resonant frequencies that every mechanical system has, resonant amplification of the oscillation (resonance step-up) occurs and the motion amplitudes increase noticeably.

These resonant oscillations of the various MRT apparatus components have a negative influence on the MRT system in many respects:

1. Strong air-borne sound (noise) is generated that represents a nuisance to the patient, the operating personnel and other persons close to the MRT apparatus.

2. The vibrations of the gradient coil as well as of the basic field magnet and their transmission to the RF resonator and the patient bed in the interior of the basic field magnet and the gradient coil contribute to an inadequate clinical image quality that can even lead to misdiagnoses (for example, in functional imaging, fMRI).

3. When the oscillations of the outer shell are transmitted via the poorly thermally conducting rods to the inner shell, or when the superconductor itself is excited to oscillate, then an increased helium evaporation occurs in the inside of the shell, so that an correspondingly greater amount of liquid helium must be replenished, leading to higher costs.

4. High costs also arise due to the necessity of installing a vibration-damping system (similar to an optical table) in order to suppress transmission of the oscillations to the floor.

The excitation of these mechanical or acoustic resonances is dependent on the parameters that define the imaging sequences and including the switching of the gradient pulses. Parameters that excite the gradient-induced mechanical oscillations are, for example, the repetition time TR given fast gradient echo sequences or the echo-echo spacing given echo-planar imaging (EPI sequences).

If these dependencies are known, the parameter set that defines the imaging sequences can be limited to such an extent that an excitation of mechanical resonances no longer occurs given periodic switching of the gradients.

The problem faced by those in the field of MR system design is to measure the dependency of resonance ranges with respect to various sequence parameters.

Conventionally, sound level and helium evaporation rate, for example, are directly determined with suitable measuring instruments as a function of the frequency of a sinusoidal gradient pulse train. Measurements of acoustic pressure and evaporations are manually examined for existing resonance locations and, when these are noted, the software of the system computer is informed of their position (referred to as "center frequency") as well as their width.

Special measuring instruments such as, for example, microphones with appropriate electronics as well as sensitive gas flow meters are required for such a procedure and these are not included in the standard equipment of an MR tomography apparatus—if only for reasons of cost. For this reason, such measurements are very complicated and are done only for a few representative units of each model series. This has the disadvantage that manufacturing tolerances or local peculiarities, as a result of which devices in the same model series may differ, lead to shifts of the center frequency or to a variation of the bandwidth, which is in turn expressed in an increased noise emission and an increased helium evaporation rate. Moreover, the image quality is degraded—as mentioned above.

SUMMARY OF THE INVENTION

An object of the present invention is to provide a method with which the sequence parameter-dependency of the resonances can be determined in a simpler way, and wherein this determination can be made for every MRT apparatus.

This object is inventively achieved in accordance with the invention in method for determining acoustic resonances in a magnetic resonance tomography system including the steps of implementing a resonance measurement by applying a number of alternating gradient pulses that have a fixed time spacing relative to one another, and applying an excitation pulse and obtaining one or a plurality of MR signals, evaluating the MR signal of the resonance measurement with reference to at least one parameter characterizing the acoustic resonance of the MRT system, repeating the aforementioned steps with variation of the time spacing of the gradient pulses, forming a resonance curve on the basis of the value of the characteristic parameter of the resonance measurement as function of the varied time spacing, and determining the resonance or resonances of the MRT system from the resonance curve.

In order to suppress additional effects that likewise influence the resonant behavior of the characteristic parameter, the resonance measurement can be associated with a non-resonance exciting reference measurement in an embodiment of the invention. Such a reference measurement is meaningful but not compulsory.

For example, the determination of the resonances can in accordance with the invention ensue automatically by means of suitable software.

In the case of a resonance measurement with reference measurement, it is advantageous to apply the two alternating gradient pulses of the reference measurement and the alternating gradient pulses of the resonance measurement to the same gradient coil axis of the MRT system.

Likewise, the shape of the gradient pulses of the reference measurement is advantageously identical to the shape of the gradient pulses of the resonance measurement.

Advantageously, the excitation pulse in the resonance measurement is only emitted in after a number of gradient pulses. In the case of a resonance of the MRT system, a mechanical excitation of natural oscillations is thereby enabled.

In a version of the inventive method employing a reference measurement, the measurement of the MR reference signal as well as the measurement of the MR signal in the resonance measurement ensues immediately after the excitation pulse.

The parameters characterizing an acoustic resonance of the MRT system of this version can be amplitude, frequency or phase of the MR reference signal or frequency or phase of the resonance signal.

In a further version of the inventive method employing a reference measurement, the respective gradient pulse trains in the reference measurement and in the resonance measurement extend beyond the point in time of the excitation. Additionally, the measurement of the MR reference signal as well as the measurement of the MR signal in the resonance measurement ensue during the further gradient pulse.

The parameters characterizing an acoustic resonance of the MRT of this further version embodiment can be amplitude, frequency, phase or echo time or time interval between the excitation pulse and the occurrence of the echo maximum of the MR reference signal, or of the resonance signal.

In a third version of the inventive method employing a reference measurement, the reference measurement and the resonance measurement are initiated by the same excitation pulse, by the reference measurement ensuing after the emission of the excitation pulse and the resonance measurement following immediately thereafter.

The method is implemented for each gradient coil of the gradient system present in the MRT apparatus.

Another method for determining acoustic resonance in a magnetic resonance tomography system is in accordance with the invention includes the steps of implementing a resonance measurement by applying an excitation pulse and a number of alternating gradient pulses that have the same time spacing, and obtaining a number of MR signals, filling the k-space matrix with the obtained MR signals and transforming the matrix into the image domain, repeating the aforementioned steps with variation of the time spacing of the gradient pulse, forming a resonance curve in which the intensity of image artifacts occurring in a defined region of the image is entered as a function of the varied time spacing, and determining the resonance or resonances of the MRT system from the resonance curve.

Here, as well, the determination of the resonance(s) can inventively ensue, for example, automatically by means of suitable software.

It is again advantageous to implement a reference measurement in addition to the actual resonance measurement by applying two gradient pulses alternating in operational sign following the excitation pulse and before the gradient pulses of the resonance measurement, that have the same fixed time spacing relative to one another as do the gradient pulses of the following resonance measurement, and obtaining one or more magnetic resonance reference signals.

It is likewise advantageous to apply the two alternating gradient pulses of the reference measurement and the alternating gradient pulses of the resonance measurement to the same gradient coil of the MRT system.

The shape of the gradient pulses of the reference measurement should likewise be identical to the shape of the gradient pulses of the resonance measurement.

Advantageously, the reference measurement and the resonance measurement are initiated by the same excitation pulse by the reference measurement ensuing after the application of the excitation pulse and the resonance measurement following immediately thereafter. Both measurements (reference and resonance measurement) thus can be integrated in one measuring event.

In order to assure a uniform filling of the k-space matrix, short phase encoding gradient pulses are respectively activated between the alternating gradient pulses of the resonance measurement.

It is again advantageous to implement this further embodiment of the inventive method for each gradient coil in the MRT system.

The above object also is achieved in accordance with the invention in a magnetic resonance tomography apparatus that is suitable for the implementation any of the above-described methods and variation thereof.

The inventive method has the advantage that it can be implemented within the scope of a system adjustment (during the course of building, maintaining and/or modifying the MRT system) and the resonant behavior of the MRT system that varies over longer time spans thus can be determined in the framework of, for example, a service call.

DESCRIPTION OF THE PREFERRED EMBODIMENTS

Overall, every magnetic resonance apparatus represents an oscillatable system that, as such, exhibits a considerable number of characteristic frequencies. An excitation of these characteristic frequencies is achieved, for example, by charging a gradient coil with trapezoidal gradient pulses that periodically alternate in operational sign according to the characteristic frequency. The mechanical forces that arise given such switching of a gradient coil can excite components of the MRT system to mechanical oscillations that in turn negatively influence the MRT measurement.

Figure 1A:
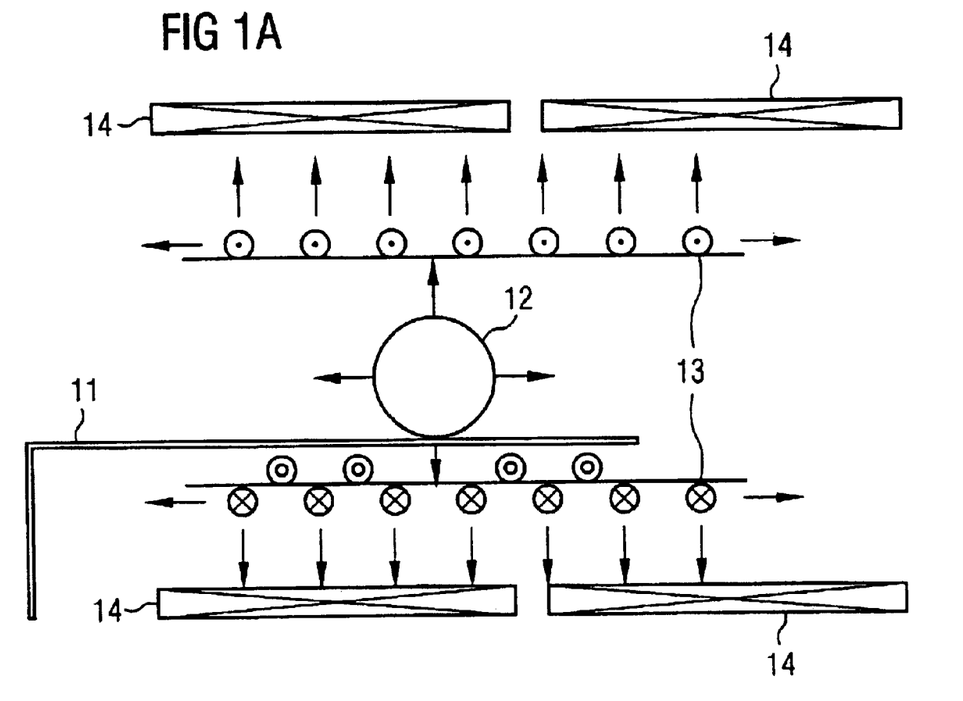
FIG. 1A is a schematic section through the gradient coil of an MRT apparatus in the z-direction with a subject situated therein.

As schematically shown in FIG. 1A, such vibration-susceptible components are, for example:

the gradient coil 13 in the z-direction;
the examination subject 12 to whom the oscillations of the patient bed 11 can be transmitted;
the large-area, metallic cryoshield 14 of the superconducting basic field magnet 1.

Figure 1B:
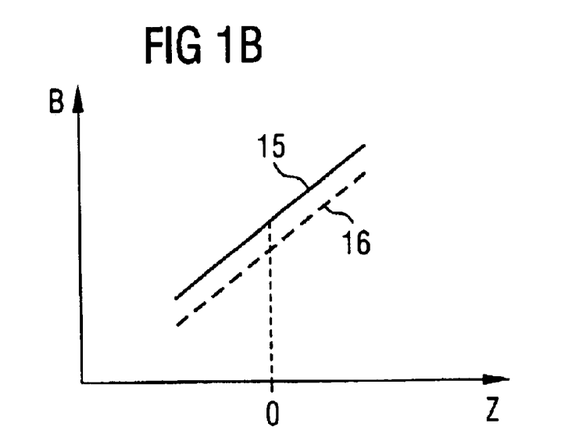
FIG. 1B shows a simplified diagram of the magnetic field of this coil as a function of the location (in the z-direction here).

Due to movement of the gradient coil 13 with current flowing therein, for example, the magnetic field of the coil itself is varied. This effect is shown in the diagram in FIG.

1B wherein the magnetic field is entered 15 as function of the location—the z-direction in this case. A topical shift of the coil has the effect that the linear curve of the gradient field shifts parallel to the location (broken line 16).

A vibration of the patient bed 11 also is transmitted to the examination subject 12 located in the magnetic field, which causes the magnetic field to change at a fixed location in the subject 12.

The large-area, metallic and therefore electrically conductive cryoshield 14 in the inside of the superconducting basic field magnet 1 also can be caused to oscillate due to a resonance of the gradient coils 3, 4, 5, causing eddy currents to be induced that in turn modify the magnetic field. Such eddy currents that influence the magnetic field also can be generated by the temporally varying (pulsed) gradient fields by themselves.

All magnetic field changes induced by oscillations also have a modifying effect on characteristic parameters of the magnetic resonance signal (for example, amplitude, frequency, phase, echo position, etc.) or on the image generated therefrom (for example, in the form of artifacts). The present invention exploits this fact.

The following fundamental procedure is employed in accordance with the invention.

A resonance measurement is undertaken at the MRT system. To that end, the MRT system is first mechanically excited by a sequence of alternating pulses according to FIG. 2A with a first pulse frequency 17 of $f_1 = \frac{1}{2}\Delta T_1$.

Figure 2A:
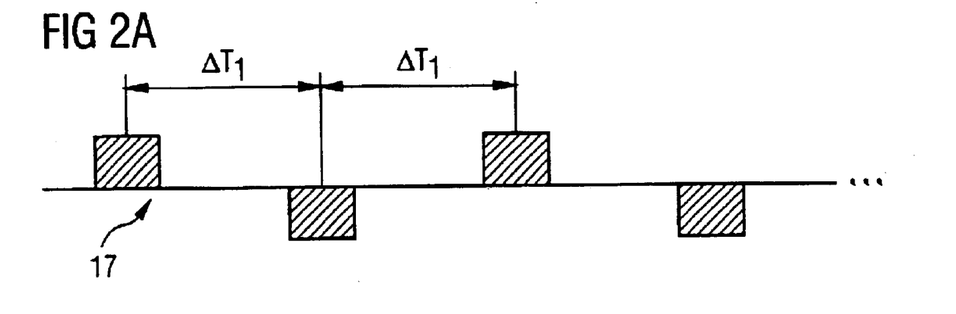
FIGS. 2A–2D show the principle of a mechanical excitation of the MRT system by alternating gradient pulses—rectangularly shown in idealized fashion with respectively different excitation frequencies.

Second, an MR signal is generated and one or more parameters characterizing this signal (for example, amplitude A, frequency f, phase $\phi$) are determined as a function of the excitation frequency.

Figure 2B:
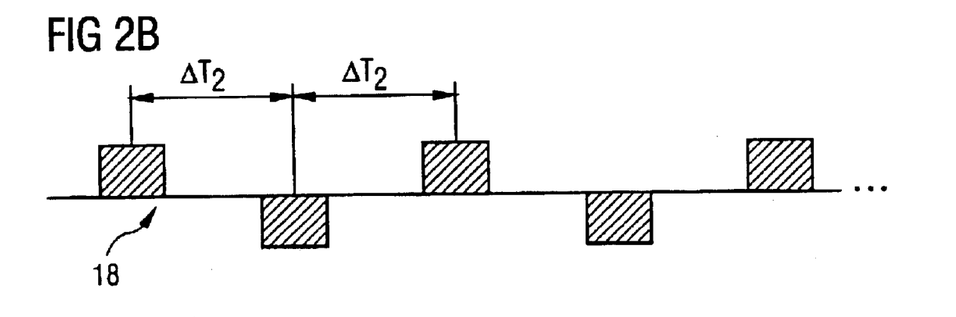
Figure 2C:
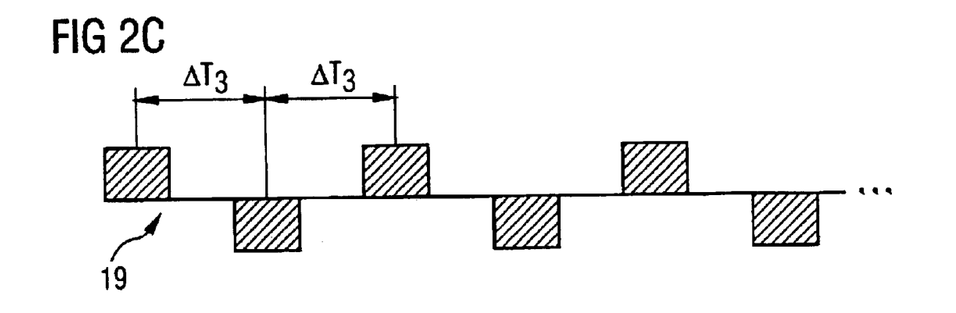
Figure 2D:
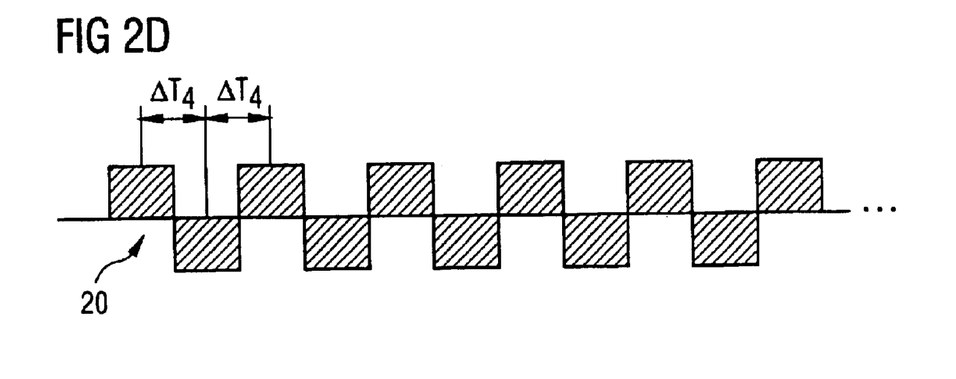
Figure 5:
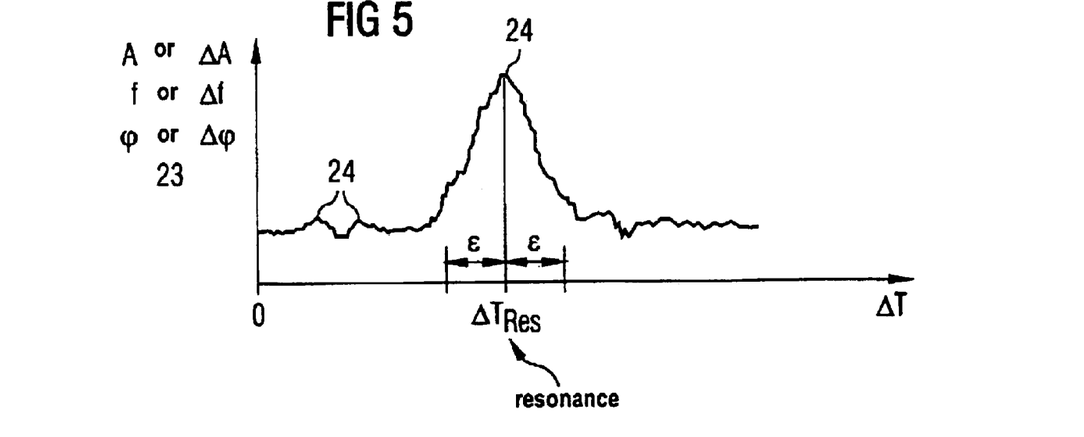
FIG. 5 shows the dependency of the parameter or of the parameter change on the excitation frequency of the gradient pulse sequence in the form of a resonance curve.

Both steps are repeated according to FIGS. 2B, 2C and 2D, with the excitation frequency continuously modified, for example increased (18: $f_2 = \frac{1}{2}\Delta T_2$, 19: $f_3 = \frac{1}{2}\Delta T_3$, 20: $f_4 = \frac{1}{2}\Delta T_4$) and the parameter or parameters of the respective MR signals are determined at the same time. The parameters are entered as function of the excitation frequency. As shown in FIG. 5, a curve arises which represents the resonant behavior of the MRT system. This curve is interpreted in view, for example, of its resonance locations that arise as maximums.

In a simple experiment of such a resonance measurement, it is fundamentally sufficient to observe the respective parameters only in the steady (i.e. resonant) state. It should be noted, however, that other effects could have an influence on these parameters in addition to the oscillation-induced behavior of the parameters characterizing the acoustic resonance of the MRT system. For example, oscillation-induced magnetic field changes (to which, for example, the amplitude A is directly proportional) are additionally influenced by noise fields induced by eddy currents. Since the gradient pulse pattern also changes when sampling the resonance curve, these noise fields also can change, for example, as a function of $\Delta T$, causing an unwanted, additional dependency to be superimposed on the desired mechanical resonance curve (for example, of A).

Such an additional dependency can be eliminated by comparing the resonance measurement to a previously implemented reference measurement using only a few gradient pulses (so that no excitation of resonant oscillations of the MRT apparatus can occur). Such noise fields, for example, are already in their steady state after a few gradient pulses. Their influences thus drops out when considering differences of the parameters between the reference measurement and the resonance measurement.

Figure 3:
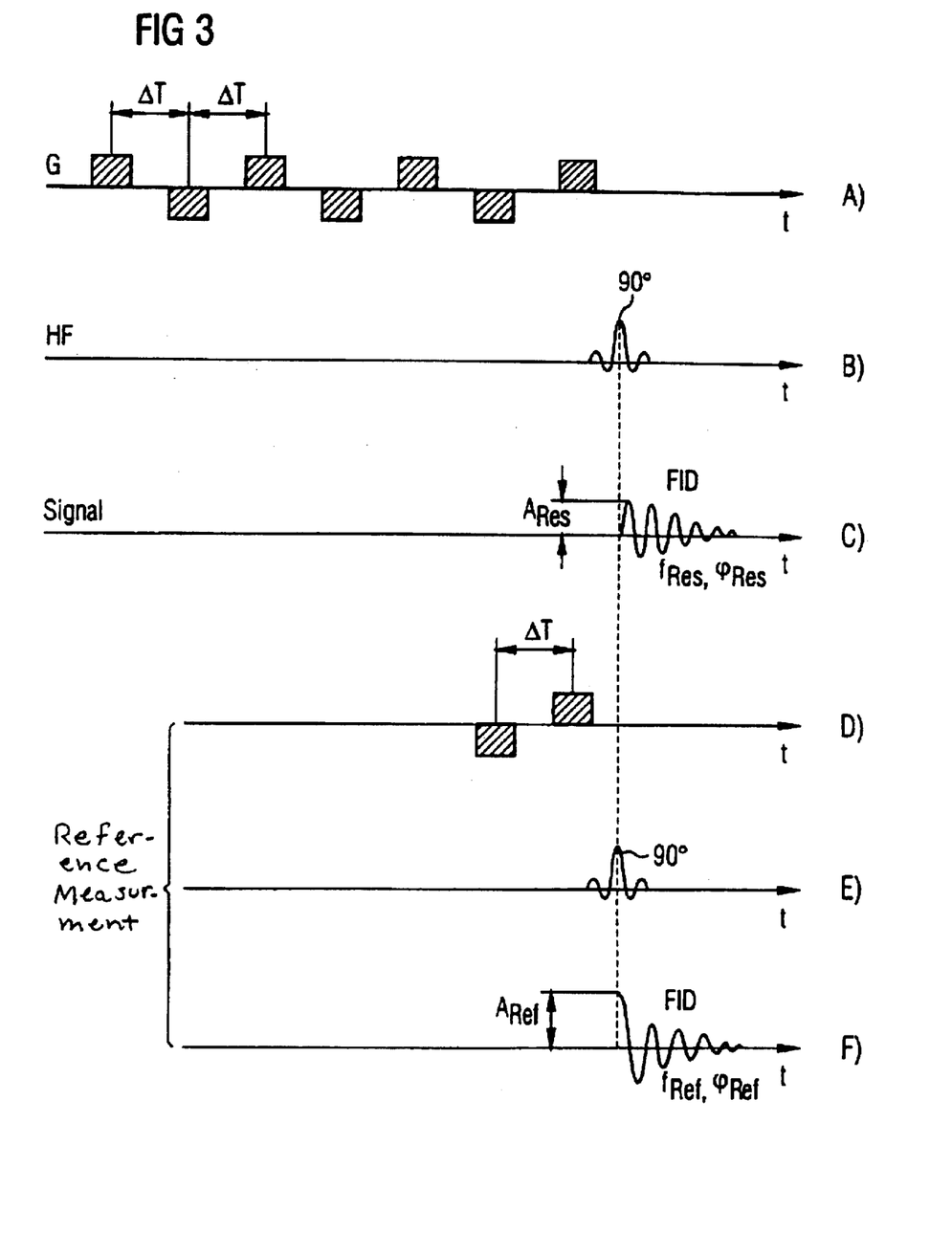
FIG. 3 shows the difference of a measured FID signal in terms of phase and/or amplitude between a mechanically exciting MRT measurement and a non-exciting reference measurement.

This fundamental procedure shall now be explained in greater detail on the basis of a first example shown in FIG. 3.

First, a reference measurement is undertaken at the MRT system by emitting a 90° RF pulse (E) after two alternating, for example, trapezoidal gradient excitation pulses (D), and the MR signal in the form of an FID signal (free induction decay signal (F) is read out immediately thereafter. The FID signal of this reference measurement is defined, for example, by its amplitude $A_{Ref}$, its frequency $f_{Ref}$ as well as by its phase $\phi_{Ref}$.

Next, the MRT system is excited by a defined number of gradient pulses (A) of the same nature (same shape and frequency) as in the reference measurement (seven alternating pulses in this example). Only then is a 90° RF pulse (B) emitted, which now generates an FID signal (C) that differs in amplitude, frequency and phase from the FID signal (F) of the reference measurement dependent on the resonant behavior of the MRT system.

$$\Delta A_{Res} = A_{Ref} - A_{Res},$$

$$\Delta f_{Res} = f_{Ref} - f_{Res},$$

$$\Delta \phi_{Res} = \phi_{Ref} - \phi_{Res}.$$

A resonance only occurs when the frequency of the applied pulse sequence (A) excites a characteristic oscillation of the MRT system. A number of alternating excitation pulses are needed for this purpose. The resonance measurement is implemented such that the resonance occurring at a resonant excitation frequency of the gradient pulses can be measured by the parameters (A, f, $\phi$, etc.) being observed.

The reference measurement itself is unsuited for placing the MRT system in oscillation. Even if the frequency of the gradient pulses of the reference measurement coincides with a characteristic frequency of the system, i.e. a resonant frequency is "hit", the low number of pulses is inadequate for generating resonance that is reflected in measurable parameter changes with respect to the MR signal. The reference measurement, however, is needed—as set forth above—for considering the influence of other effects (for example, field changes that derive due to eddy currents induced by the gradients) that likewise change the magnetic field but are not caused by mechanical oscillation.

Figure 4A:
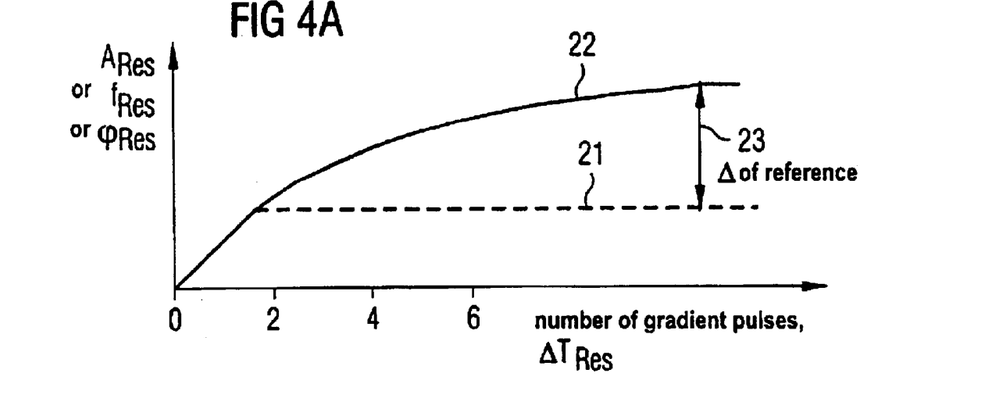
FIG. 4A is a diagram showing that given mechanical resonance the parameter changes associated with this resonance—by comparison to a non-exciting reference measurement—intensify given lasting excitation.

The fact that the mechanical resonance of an MRT system or its effect intensifies given continuing excitation, i.e. given an increasing number of the exciting gradient pulses, is illustrated in FIG. 4A.

Figure 4B:
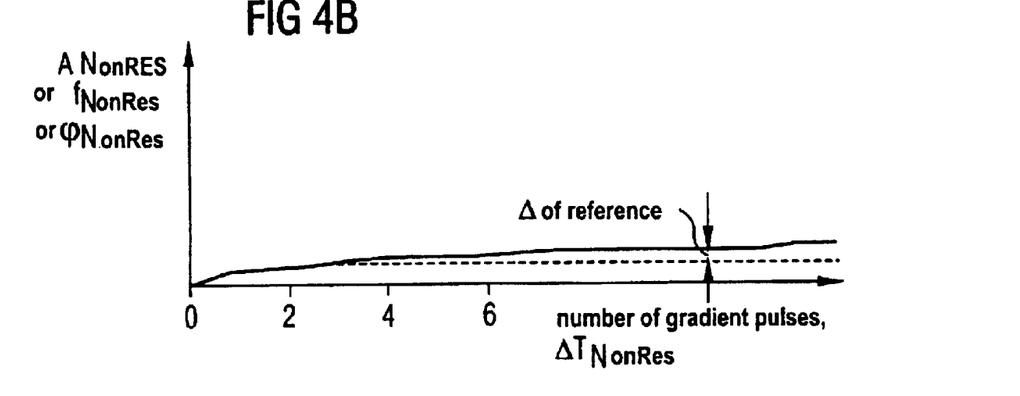
FIG. 4B is a diagram showing that only insignificant parameter changes occur and that these also not intensified given a gradient pulse sequence that does not mechanically excite the MRT system.

In FIGS. 4A and 4B, a parameter 22 (for example, amplitude, frequency, phase, etc.) describing the MR signal is entered as a function of the number of applied gradient pulses, with the frequency of the applied gradient pulse train in FIG. 4A being suitable for placing the MRT system into mechanical resonance. The broken line 21 shows the magnitude of the corresponding parameter of a non-resonant reference measurement. It can be clearly seen that, given resonant excitation of the MRT system, the deviation 23 of the respective parameter value from the parameter value of the reference measurement ($\Delta A = A_{Ref} - A_{Res}$, $\Delta f = f_{Ref} - f_{Res}$, $\Delta \phi = \phi_{Ref} - \phi_{Res}$) becomes greater given an increasing number of applied gradient pulses. In FIG. 4B, wherein the frequency of the gradient pulse train does not generate resonance, virtually no deviation of the parameter value of the MR signal, measured after long excitation, from the parameter value of the MR signal of the reference measurement is present, even after a longer excitation of the MRT systems with a high number of gradient pulses.

In order to be able to translate a change of the magnetic field produced due to a resonance into a notable change of the MR signal (for example, the amplitude, frequency or phase thereof), a greater number of excitation pulses is required. When the respective parameter (A, f, φ) or the respective parameter change 23 ($\Delta A = A_{Ref} - A$, $\Delta f = f_{Ref} - f$, $\Delta\phi = \phi_{Ref} - \phi$) is entered as function of the frequency of the excitation gradient pulse train ½ΔT, then a resonance curve is obtained according to FIG. 5. The maximums of this curve ($\Delta T_{Res}$) represent the resonant locations of the MRT system.

In practical terms this means the frequency range of a gradient pulse train in later, actual MRT measurements should be limited so that, for example in the case of FIG. 5, it does not contain frequencies in the interval [$\Delta T_{res} - \epsilon$; $\Delta T_{res} + \epsilon$]. Inventively, the system computer of the MRT system is informed of all resonance intervals. The system computer then does not permit measurements to be carried out with a gradient pulse sequence that comprises a frequency lying in one of these intervals.

It should be noted that the analysis of the resonance curves could ensue automatically using suitable software. For example, the software seeks the maximum of the curve (resonant frequency) above a defined threshold and seeks the two points of lower and higher frequency at which the curve has dropped to half this maximum value (bandwidth). The identification of more than one resonant location can likewise be automated. Alternatively, the type-specific frequency or frequencies and bandwidth or bandwidths can be prescribed (in order to have good start values for the search for the resonance or resonances) and the system-specific value or values are determined proceeding therefrom.

Figure 6:
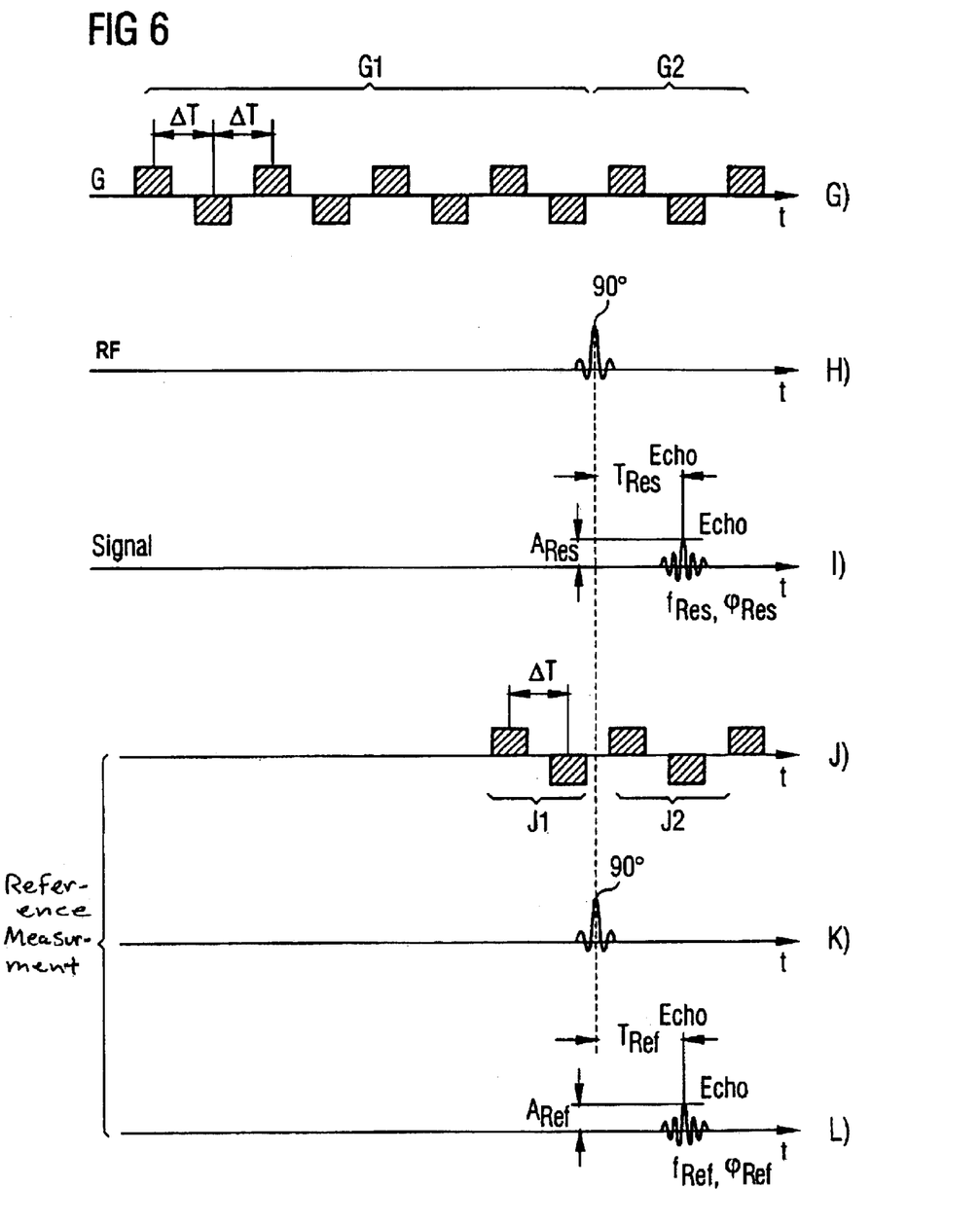
FIG. 6 shows the difference as to echo time and/or echo frequency and/or phase and/or amplitude between a measured gradient echo signal of a mechanically exciting MRT measurement and a non-exciting reference measurement.

FIG. 6 shows a second example of an inventive method, wherein a reference measurement (J) (K) (L) is likewise first undertaken at the MRT system with a 90° RF pulse emitted in (K) after two alternating, for example trapezoidal gradient excitation pulses (J1), but the MR signal in the form of a gradient echo signal is only read out (L) after the alternating readout pulses (J2).

In addition to being defined by its amplitude $A_{Ref}$, its frequency $f_{Ref}$ and its phase $\phi_{Ref}$, the gradient echo signal of this reference measurement is likewise defined by its echo time $T_{Ref}^{Echo}$.

Next, the MRT system is excited (G) by a defined number (eight alternating pulses in this example) of gradient pulses of the same nature as in the reference measurement (G1) and a 90° RF pulse (H) is subsequently emitted. After two readout gradient pulses (G2), a gradient echo signal (I) is obtained that, given the occurrence of resonance of the MRT system due to the applied pulse sequence, can likewise be distinguished from the gradient echo signal of the reference measurement in view of its echo time $T_{Ref}^{Echo}$ in addition to amplitude, frequency and phase:

$$\Delta T_{Res}^{Echo} = T_{Ref}^{Echo} - T_{Res}^{Echo}.$$

(All parameters characterizing the MR signal need not simultaneously exhibit a resonant behavior.)

Accordingly, resonances of the MRT system also can be determined by entering $\Delta T^{Echo}$ as a function of the gradient pulse train frequency and by identifying the maximums of this curve.

Figure 7A:
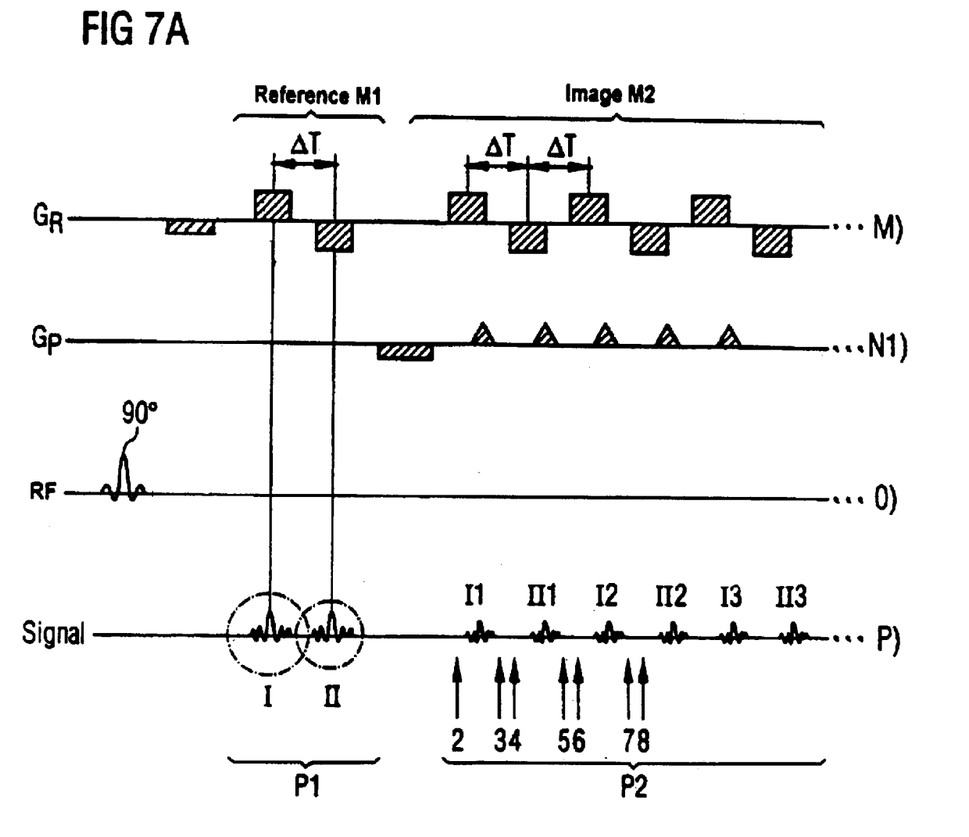
FIG. 7A shows a blipped EPI sequence (echo-planar imaging sequence) with which the entire measurement matrix in k-space is sampled in a serpentine path after a single 90° RF excitation.

FIG. 7A shows a third example wherein a sequence is referred to as a "blipped EPI sequence" (blipped echo-planar imaging) is implemented in the section designated as "image". A number of phase-encoded echoes are employed for filling the raw data matrix 27 in k-space. The sampling path of the raw data matrix 27 in k-space is shown in FIG. 7D. Multiple gradient echoes are generated (P2) after a 90° excitation pulse (O). The phase encoding (N1) ensues via small gradient pulses (referred to as blips) respectively between the alternating frequency encoding exemplary readout gradients (M2). Initially, thus, a single excitation (O) is implemented and all data are subsequently recorded in a conventional gradient echo technique according to the trajectory shown in FIG. 7D.

With a blipped EPI sequence according to the example of FIG. 7A, it is possible to identify resonant locations of the MRT system.

Figure 7B:
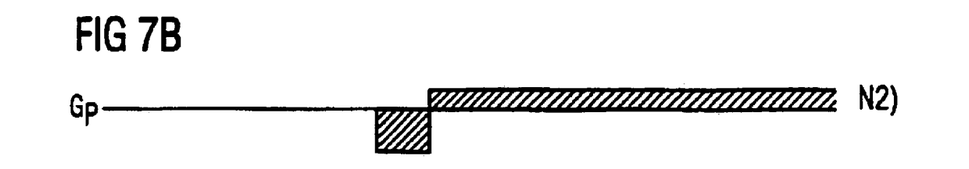
FIG. 7B shows a possible phase encoding for a non-blipped EPI sequence with a constant phase encoding gradient adjacent to the readout gradient train.
Figure 7C:
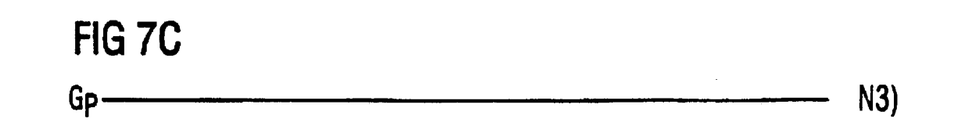
FIG. 7C shows an investigation of the resonance behavior of the MRT system with a phase encoding entirely foregone.
Figure 7D:
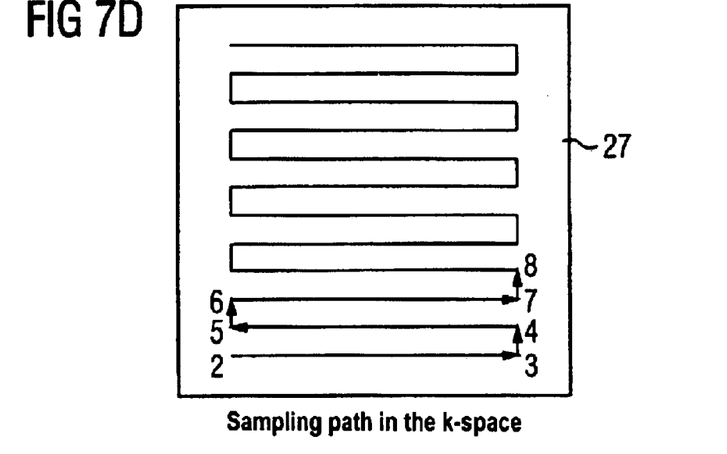
FIG. 7D shows the serpentine sampling of the measurement matrix in the k-space according to an EPI sequence according to FIG. 7A.
Figure 8A:
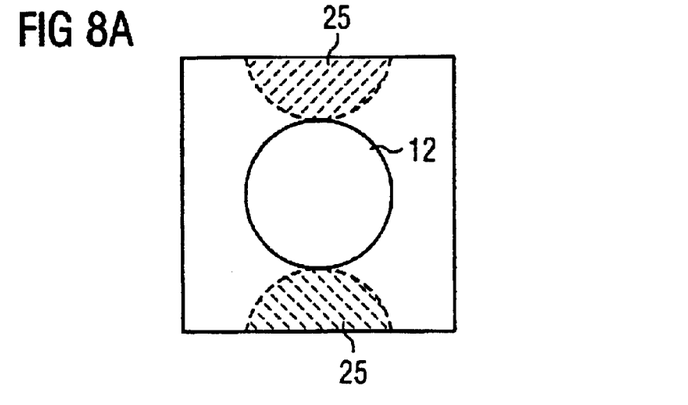
FIG. 8A shows the occurrence of image artifacts in the form of as N/2 ghosts.

Given sampling of a k-space according to FIG. 7D by means of an EPI sequence according to FIG. 7A, even the slightest asymmetries between the positive and negative gradient amplitudes lead to a non-uniform filling of the k-matrix, which is expressed in the form of image artifacts after the Fourier transformation. Given an EPI sequence, this leads to the occurrence of artifacts referred to as N/2 ghosts 25, i.e. a ghost image according to FIG. 8A that is shifted by exactly half the image lines in the direction of the phase coding. The intensity of the N/2 ghost 25 of an EPI sequence is especially pronounced in the proximity of acoustic resonances of the MRT system, for example which reason the intensity 26 of the N/2 ghost 25 of an EPI sequence— dependent on the period duration ΔT of the gradient pulse train—yields an interpretable resonance curve according to FIG. 8B.

Figure 8B:
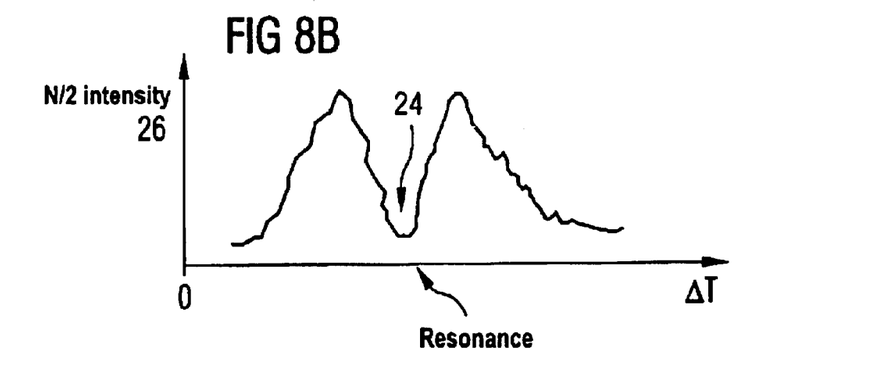
FIG. 8B shows the dependency of the intensity of the N/2 ghosts on the excitation frequency of the gradient pulse sequence in the form of a resonance curve.

The resonance curve of the N/2 ghost intensity in the EPI imaging according to FIG. 8B differs significantly from the resonance curve of the characteristic quantities (amplitude, frequency or phase) of an MR signal as shown, for example, in FIG. 5. The difference is that the N/2 ghost intensity exhibits a minimum 24 at the resonant frequency $\omega_{res}$ or at the time spacing of the gradient pulse $\Delta T_{res}$ that generates the resonance. Maximums of the N/2 ghost intensity are situated at both sides of the resonant location, these characterizing the transition between the resonant condition and the non-resonant condition of the system. The characteristic of the N/2 ghost resonance curve is established by the type of data processing and need not be explained in greater detail.

It should be noted that a non-blipped EPI imaging— wherein a constant phase encoding gradient is present during the readout gradient train according to FIG. 7B—is also suited for the above resonance determination method. The same is also true of a segmented EPI method (not shown) wherein k-space is not covered in one step but, for example, in 2, 3 ... steps, i.e., for example, the $1^{st}$, $4^{th}$, $7^{th}$, ... rows in the first step, the $2^{nd}$, $5^{th}$, $8^{th}$, ... rows in the second step, the $3^{rd}$, $6^{th}$, ... rows in the third step, etc. Instead of N/2 ghosts, other kinds of ghosts, which can be utilized for resonance analysis in exactly the same way, occur in the case of a segmented EPI imaging.

In order to determine the resonance behavior of an MRT system from the aforementioned characteristic MR signal data (such as amplitude, frequency, phase) on the basis of an EPI sequence, a phase encoding must be foregone according to FIG. 7C for various reasons. This case cannot really be termed EPI imaging, since a true image does not arise from the Fourier-transformed time signals because of the absence of phase coding. Nonetheless, resonances can be determined in the following way merely by studying the central k-space row.

As shown in FIG. 7A, two reference gradient pulses are activated (M1) between the 90° excitation pulse (O) and the gradient pulse sequence (M2) referred to as "image", the time spacing ΔT of these two reference gradient pulses M2) corresponding to the time spacing of the gradient pulses of the EPI sequence (M1). When comparing, in particular, the phase of the echo maximum under the positive reference pulse (I) to the phases of the echo maximums under the positive EPI gradient pulses (I1, I2, I3, . . . ), large differences will be found in the case of a resonance of the MRT system. The same is true when comparing, in particular, the phase of the echo maximum under the negative reference gradient pulses (II) to the phases of the echo maximums under the negative EPI gradient pulses (II1, II2, II3, . . . ). By varying ΔT, i.e. the temporal sequence of the gradient pulses M1), M2), a resonance curve that can be interpreted in terms of its resonant locations in the form of maximums can again be obtained.

Overall, frequencies in ranges up to a few kilohertz, where the dominant resonances lie for many MRT systems, can be covered with the two versions (EPI sequence with or without phase encoding). The exact numerical values are dependent on system parameters such as, for example, gradient amplitude and slew rate (rise or decay rate of the gradient pulse that is usually not exactly rectangular, but trapezoidal).

The resonance curve that is interpreted according to one of the aforementioned methods (EPI sequence with or without phase encoding) preferably is implemented for every gradient coil of the gradient system of the MRT apparatus. In this way, only measurements based on sequences (gradient pulse) that contain none of these resonant frequencies are implemented with the MRT apparatus.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining acoustic resonances in a magnetic resonance apparatus, comprising the steps of:
   (a) implementing a resonance measurement in a magnetic resonance tomography apparatus by applying a plurality of alternating gradient pulses having a fixed time spacing relative to each other, applying an excitation pulse, and obtaining at least one magnetic resonance signal;
   (b) evaluating said magnetic resonance signal to obtain a value of at least one parameter characterizing acoustic resonance of said magnetic resonance tomography apparatus;
   (c) repeating steps (a) and (b) multiple times and varying said time spacing from repetition-to-repetition;
   (d) forming a resonance curve from the respective values of said characteristic parameter in said multiple repetitions as a function of the varied time spacing; and
   (e) determining a resonance of said magnetic resonance tomography apparatus from said resonance curve.

2. A method as claimed in claim 1 comprising, in addition to implementing said resonance measurement, implementing a reference measurement in said magnetic resonance tomography apparatus by applying a reference measurement excitation pulse and two reference measurement gradient pulses alternating in operational side and exhibiting the said time spacing from each other as said time spacing of said gradient pulses in said resonance measurement, and obtaining at least one magnetic resonance reference signal, evaluating said magnetic resonance reference signal with respect to said at least one parameter characterizing acoustic resonance of said magnetic resonance tomography system to obtain a value of said at least one parameter, and forming said resonance curve in step (d) from a combination of the value of said characteristic parameter obtained in said resonance measurement and the value of said characteristic parameter obtained in the reference measurement.

3. A method as claimed in claim 2 comprising repeating said reference measurement and evaluating said magnetic resonance reference signal for each repetition in step (c).

4. A method as claimed in claim 3 comprising forming said resonance curve in step (d) from a difference, as said combination, between the respective values of the characteristic parameter obtained in the reference measurements and the respective values of said characteristic parameter obtained in said reference measurements.

5. A method as claimed in claim 2 wherein said magnetic resonance tomography apparatus has a gradient system composed of a plurality of gradient coils, and comprising applying said two alternating gradient pulses in said reference measurement with one of said gradient coils and applying said alternating gradient pulses of said resonance measurement with said one of said gradient coils.

6. A method as claimed in claim 2 comprising emitting said two alternating gradient pulses in said reference measurement with a shape identical to a shape of said alternating gradient pulses in said resonance measurement.

7. A method as claimed in claim 2 wherein step (a) comprises emitting said excitation pulse in said resonance measurement only after said plurality of gradient pulses.

8. A method as claimed in claim 7 comprising measuring said magnetic resonance reference signal and measuring said magnetic resonance signal in said resonance measurement immediately after said excitation pulse.

9. A method as claimed in claim 8 comprising selecting said parameter characterizing said acoustic resonance of said magnetic resonance tomography apparatus, for evaluating said magnetic resonance signal, from the group consisting of an amplitude of said magnetic resonance signal, a frequency of said magnetic resonance signal, and a phase of said magnetic resonance signal, and selecting said parameter characterizing said acoustic resonance of said magnetic resonance tomography apparatus for evaluating said magnetic resonance reference signal from the group consisting of an amplitude of said magnetic resonance reference signal, a frequency of said magnetic resonance reference signal, and a phase of said magnetic resonance reference signal.

10. A method as claimed in claim 7 wherein said two alternating gradient pulses of said reference measurement and said plurality of alternating gradient pulses of said resonance measurement form a gradient pulse train, and wherein said gradient pulse train has a pulse train portion beyond a point in time of said excitation pulse, and comprising measuring said magnetic resonance reference signal and measuring said magnetic resonance reference signal in said resonance measurement during said pulse train portion.

11. A method as claimed in claim 10 wherein said resonance measurement has an echo time comprised of a time interval between said excitation pulse and an occurrence of an echo maximum of said resonance signal, and wherein said reference measurement has an echo time associated therewith comprising a time interval between said excitation pulse and an occurrence of an echo maximum of said magnetic resonance reference signal, and comprising selecting said parameter characterizing said acoustic resonance of said magnetic resonance tomography apparatus for evaluating said resonance signal from the group consisting of an amplitude of said resonance signal, a frequency of said resonance signal, a phase of said resonance signal, and said echo time in said resonance measurement, and selecting said parameter characterizing said acoustic resonance of said magnetic resonance tomography apparatus for evaluating said magnetic resonance reference signal from the group consisting of an amplitude of said magnetic resonance reference signal, a frequency of said magnetic resonance reference signal, a phase of said magnetic resonance reference signal, and said echo time associated with said magnetic resonance measurement.

12. A method as claimed in claim 2 comprising implementing said reference measurement after emitting said excitation pulse in said resonance measurement and measuring said resonance signal after measuring said magnetic resonance reference signal.

13. A method as claimed in claim 1 comprising selecting said parameter characterizing said acoustic reference of said magnetic resonance tomography apparatus from the group consisting of an amplitude of said magnetic resonance signal, a frequency of said magnetic resonance signal, and a phase of said magnetic resonance signal.

14. A method as claimed in claim 1 wherein said magnetic resonance tomography apparatus has a gradient system composed of a plurality of gradient coils, and comprising, for each of said coils, executing steps (a), (b), (c), (d) and (e).

15. A method as claimed in claim 14 comprising, for each of said coils, in addition to implementing said resonance measurement, implementing a reference measurement, implementing a reference measurement in said magnetic resonance tomography apparatus by applying a reference measurement excitation pulse and two reference measurement gradient pulses alternating in operational side and exhibiting the said time spacing from each other as said time spacing of said gradient pulses in said resonance measurement, and obtaining at least one magnetic resonance reference signal, evaluating said magnetic resonance reference signal with respect to said at least one parameter characterizing acoustic resonance of said magnetic resonance tomography system to obtain a value of said at least one parameter, and forming said resonance curve in step (d) from a combination of the value of said characteristic parameter obtained in said resonance measurement and the value of said characteristic parameter obtained in the reference measurement.

16. A method for determining acoustic resonance in a magnetic resonance tomography apparatus, comprising the steps of:
(a) implementing a resonance measurement in a magnetic resonance tomography apparatus by applying an excitation pulse and a plurality of alternating gradient pulses having equidistant time spacings from each other, and thereby obtaining a plurality of magnetic resonance signals;
(b) filling a k-space matrix with said magnetic resonance signals and transforming said matrix into the image domain to obtain a representation of an image containing image artifacts, said image artifacts having an intensity in a defined region of said representation of said image;
(c) repeating steps (a) and (b) while varying said time spacing from repetition-to-repetition;
(d) forming a resonance curve from the intensity of the image artifacts in the respective repetitions as a function of the varied time spacing; and
(e) determining a resonance of said magnetic resonance tomography apparatus from said resonance curve.

17. A method as claimed in claim 16 comprising implementing a reference measurement for correcting a phase of said resonance measurement when filling said k-space matrix, by applying to reference measurement gradient pulses alternating in operational sign following said excitation pulse and before said gradient pulses of said resonance measurement, said two reference gradient pulses having a time spacing therebetween equal to said time spacing of said gradient pulses in said resonance measurement, and thereby obtaining at least one magnetic resonance reference signal, filling a reference measurement k-space matrix with said magnetic resonance reference signals and transforming said reference measurement matrix into the image domain to obtain a representation of a reference image exhibiting image artifacts having an intensity in a defined region of said representation of said reference image, and in step (d) forming said resonance curve from a combination of the intensity of the image artifacts from said repetitions of said resonance measurement and the intensity of the image artifacts in said reference measurement.

18. A method as claimed in claim 17 wherein said magnetic resonance tomography apparatus has a gradient coil system composed of a plurality of gradient coils and comprising applying said two alternating gradient pulses of said resonance measurement with one of said gradient coils and applying said alternating gradient pulses of said resonance measurement with said one of said gradient coils.

19. A method as claimed in claim 17 comprising applying said two gradient pulses in said reference measurement with a pulse shape identical to a shape of the gradient pulses of said resonance measurement.

20. A method as claimed in claim 17 comprising implementing said reference measurement after said excitation pulse of said resonance measurement and measuring said magnetic resonance signal immediately after said reference measurement.

21. A method as claimed in claim 16 comprising emitting a plurality of short phase encoding gradient pulses respectively between said plurality of alternating gradient pulses in said resonance measurement.

22. A method as claimed in claim 16 wherein said magnetic resonance tomography apparatus has a gradient coil system composed of a plurality of gradient coils, and comprising executing steps (a), (b), (c), (d) and (e) for each of said gradient coils.

23. A magnetic resonance apparatus comprising:
a magnetic resonance scanner operated by a control unit for implementing a resonance measurement by applying a plurality of alternating gradient pulses having a fixed time spacing relative to each other, applying an excitation pulse, and obtaining at least one magnetic resonance signal;
an evaluation unit supplied with said magnetic resonance signal for evaluating said magnetic resonance signal to obtain a value of at least one parameter characterizing acoustic resonance of said magnetic resonance tomography apparatus;
said control unit operating said scanner to repeat said resonance measurement multiple times and varying said time spacing from repetition-to-repetition, and said evaluation unit evaluating said magnetic resonance signal or each repetition;
a processor for forming a resonance curve from the respective values of said characteristic parameter in said multiple repetitions as a function of the varied time spacing, and determining a resonance of said magnetic resonance tomography apparatus from said resonance curve.

24. An apparatus as claimed in claim 23 wherein said control unit operates said scanner to implement, in addition to implementing said resonance measurement, a reference measurement, by applying a reference measurement excitation pulse and two reference measurement gradient pulses alternating in operational side and exhibiting the said time spacing from each other as said time spacing of said gradient pulses in said resonance measurement, and obtaining at least one magnetic resonance reference signal, said evaluation unit being supplied with said magnetic resonance reference signal and evaluating said magnetic resonance reference signal with respect to said at least one parameter characterizing acoustic resonance of said magnetic resonance tomography system to obtain a value of said at least one parameter, and said processor forming said resonance curve from a combination of the value of said characteristic parameter obtained in said resonance measurement and the value of said characteristic parameter obtained in the reference measurement.

25. A magnetic resonance tomography apparatus comprising:

a magnetic resonance scanner operated by a control unit to implement a resonance measurement by applying an excitation pulse and a plurality of alternating gradient pulses having equidistant time spacings from each other, and thereby obtaining a plurality of magnetic resonance signals;

an image computer having a memory containing a k-space matrix filled with said magnetic resonance signals and transforming said matrix into the image domain to obtain a representation of an image containing image artifacts, said image artifacts having an intensity in a defined region of said representation of said image;

said control unit operating said scanner to repeat said resonance measurement while varying said time spacing from repetition-to-repetition; and a processor for forming a resonance curve from the intensity of the image artifacts in the respective repetitions as a function of the varied time spacing, and determining a resonance of said magnetic resonance tomography apparatus from said resonance curve.

26. An apparatus as claimed in claim 25 wherein said control unit operates said scanner to implement a reference measurement for correcting a phase of said resonance measurement when filling said k-space matrix, by applying to reference measurement gradient pulses alternating in operational sign following said excitation pulse and before said gradient pulses of said resonance measurement, said two reference gradient pulses having a time spacing therebetween equal to said time spacing of said gradient pulses in said resonance measurement, and thereby obtaining at least one magnetic resonance reference signal, said image computer having a further memory containing a reference measurement k-space matrix filled with said magnetic resonance reference signals and transforming said reference measurement matrix into the image domain to obtain a representation of a reference image exhibiting image artifacts having an intensity in a defined region of said representation of said reference image, and said processor forming said resonance curve from a combination of the intensity of the image artifacts from said repetitions of said resonance measurement and the intensity of the image artifacts in said reference measurement.

* * * * *